United States Patent
Kuo et al.

(10) Patent No.: US 7,916,114 B2
(45) Date of Patent: Mar. 29, 2011

(54) SHIFT REGISTER UNITS, DISPLAY PANELS UTILIZING THE SAME, AND METHODS FOR IMPROVING CURRENT LEAKAGE THEREOF

(75) Inventors: Chung-Hong Kuo, Tainan (TW); Jian-Shen Yu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/565,037

(22) Filed: Sep. 23, 2009

(65) Prior Publication Data

US 2010/0033208 A1     Feb. 11, 2010

Related U.S. Application Data

(62) Division of application No. 11/231,224, filed on Sep. 20, 2005, now Pat. No. 7,612,754.

(30) Foreign Application Priority Data

Feb. 21, 2005  (TW) .............................. 94105032 A

(51) Int. Cl.
 *G09G 3/36* (2006.01)
(52) U.S. Cl. .............. 345/100; 326/28; 326/40; 326/46; 326/63; 326/80
(58) Field of Classification Search .................... 326/28, 326/40, 46, 63, 80; 345/100, 204; 377/64–81
See application file for complete search history.

(56) References Cited

U.S. PATENT DOCUMENTS

| | | | |
|---|---|---|---|
| 4,084,106 A | 4/1978 | Ullrich | |
| 6,295,046 B1 * | 9/2001 | Hebiguchi | 345/100 |
| 6,611,248 B2 * | 8/2003 | Kanbara et al. | 345/100 |
| 6,834,095 B2 * | 12/2004 | Yu | 377/71 |
| 7,138,831 B2 * | 11/2006 | Tobita | 326/81 |
| 7,352,839 B2 * | 4/2008 | Yu | 377/64 |
| 7,406,146 B2 * | 7/2008 | Yu | 377/64 |
| 7,612,754 B2 * | 11/2009 | Kuo et al. | 345/100 |
| 2003/0210220 A1 * | 11/2003 | Hebiguchi | 345/100 |
| 2004/0028172 A1 * | 2/2004 | Yu | 377/64 |
| 2004/0032926 A1 * | 2/2004 | Yu | 377/64 |

FOREIGN PATENT DOCUMENTS

CN       1553456       12/2004

OTHER PUBLICATIONS

CN Office Action mailed Aug. 3, 2007, cited in parent application.

* cited by examiner

*Primary Examiner* — Jason M Crawford
(74) *Attorney, Agent, or Firm* — Thomas/Kayden

(57) ABSTRACT

A shift register comprising at least one shift register unit. The shift register unit comprises an input unit, at least one first TFT, and at least one second TFT. The input unit receives an input signal from the input terminal and outputs a switching control signal in accordance with a first clock signal. The gate of the first TFT is for receiving the switching control signal, the drain of the first TFT is for receiving a second clock signal, and the source of the first TFT is coupled to the output terminal. The gate and drain of the second TFT are coupled to the output terminal, and the source of the second TFT is coupled to the input unit.

3 Claims, 10 Drawing Sheets

SHIFT REGISTER UNITS, DISPLAY PANELS UTILIZING THE SAME, AND METHODS FOR IMPROVING CURRENT LEAKAGE THEREOF

CROSS-REFERENCE TO RELATED APPLICATION

This application is a division of U.S. patent application Ser. No. 11/231,224, filed Sep. 20, 2005, and entitled "Shift Register Units, Display Panels Utilizing The Same, And Methods For Improving Current Leakage Thereof," which claims the benefit of Taiwan application Serial No. 94105032 filed Feb. 21, 2005, the subject matter of which is incorporated herein by reference.

BACKGROUND

The invention relates to a shift register unit applied in a shift register, and in particular to a shift register employed in drivers of display panels.

FIG. 1 is a schematic diagram of a conventional liquid crystal display (LCD) panel. As shown in FIG. 1, LCD panel 1 comprises display array 10, data driver 11, and scan driver 12. Display array 10 comprises a plurality of pixels. Data driver 11 controls a plurality of data lines $D_1$ to $D_n$, and scan driver 12 controls a plurality of scan lines $S_1$ to $S_m$. Scan driver 12 sequentially outputs scan signals $SD_1$ to $SD_m$ to scan lines $S_1$ to $S_m$ in response to a scan control signal to turn on the pixels corresponding to a row. When a row of pixels are turned on, data driver 11 outputs corresponding video signals with gray scale values to n pixels corresponding to the row through data lines $D_1$ to $D_n$. Each of data driver 11 and scan driver 12 requires a shift register to output signals, sequentially.

Typically, a shift register comprises a plurality of identical, substantially cascaded, shift register units. For example, in a shift register of a scan driver, an output signal of each shift register unit is transmitted to a next shift register unit as its input signal and to a corresponding row of pixels through a scan line.

FIG. 2 shows a conventional shift register as disclosed in U.S. Pat. No. 4,084,106. Shift register 2 comprises two identical, substantially cascaded, shift register units $2_1$ and $2_2$. Clock signals CK and XCK are provided to shift register units $2_1$ and $2_2$, respectively. Clock signals CK and XCK have inverse phases. Each shift register unit $2_1$ or $2_2$ comprises input and output terminals, transistors T21 to T26, and capacitors C21 and C22. Output terminal $OUT_1$ of shift register unit $2_1$ is coupled to input terminal $IN_2$ of shift register unit $2_2$. Referring to FIGS. 2 and 3, shift register unit $2_1$ is given as an example. In period P1, input signal $IS_1$ and clock signal XCK are at high logic level (first state), and clock signal CK is at low logic level. Transistor T23 is thus turned on, and capacitor C21 is charged to high logic level, so that node N21 is at high logic level. Since the gate of transistor T22 is coupled to node N21, transistor T22 is turned on. Output terminal $OUT_1$ outputs output signal $OS_1$ at low logic level to input terminal $IN_2$ as input signal $IS_2$ of shift register unit $2_2$.

In a subsequent period P2, input signal $IS_1$ and clock signal XCK are transformed to being at low logic level, and clock signal CK is transformed to being at high logic level. Transistor T23 is thus turned off. Node N21, which is at high voltage level, has higher voltage due to the parasitic capacitance of transistor T22. Output signal $OS_1$ is transformed to being at high logic level. However, in practice, transistor T23 may operate in the sub-threshold region or turned-off region to generate unexpected leakage current. Node N21 does not remain at high logic level, and transistor T22 is not continuously turned on. Thus, output signal $OS_1$ does not continuously remain at high logic level, resulting in false operation of shift register unit $2_2$ and the timing of shift register 2 is in error.

SUMMARY

Shift register are provided. An exemplary embodiment of a shift register unit applied in a shift register is described. The shift register unit comprises an input unit, at least one first thin film transistor (TFT), and at least one second TFT. The input unit receives an input signal from the input terminal and outputs a switching control signal in response to a first clock signal. The gate of the first TFT is coupled to the input unit and configured to receive the switching control signal, the drain of the first TFT is configured to receive a second clock signal, and the source of the first TFT is coupled to the output terminal. The gate and the drain of the second TFT are coupled to the output terminal, and the source of the second TFT is coupled to the input unit.

Methods for improving current leakage of a shift register are provided. An exemplary embodiment of a shift register comprises a plurality of identical, substantially cascaded, shift register units, each of which having an input terminal and an output terminal. An exemplary embodiment of the method comprises steps of: receiving an input signal; transforming the input signal to a switching control signal in response to a first clock signal; transmitting a second clock signal to the output terminal in response to the switching control signal; and maintaining the state of the switching control signal in response to the second clock signal.

DESCRIPTION OF THE DRAWINGS

The inventions will become more fully understood from the detailed description given hereinbelow and the accompanying drawings, given by way of illustration only and thus not intended to be limitative of the invention.

DETAILED DESCRIPTION

Figure 1:
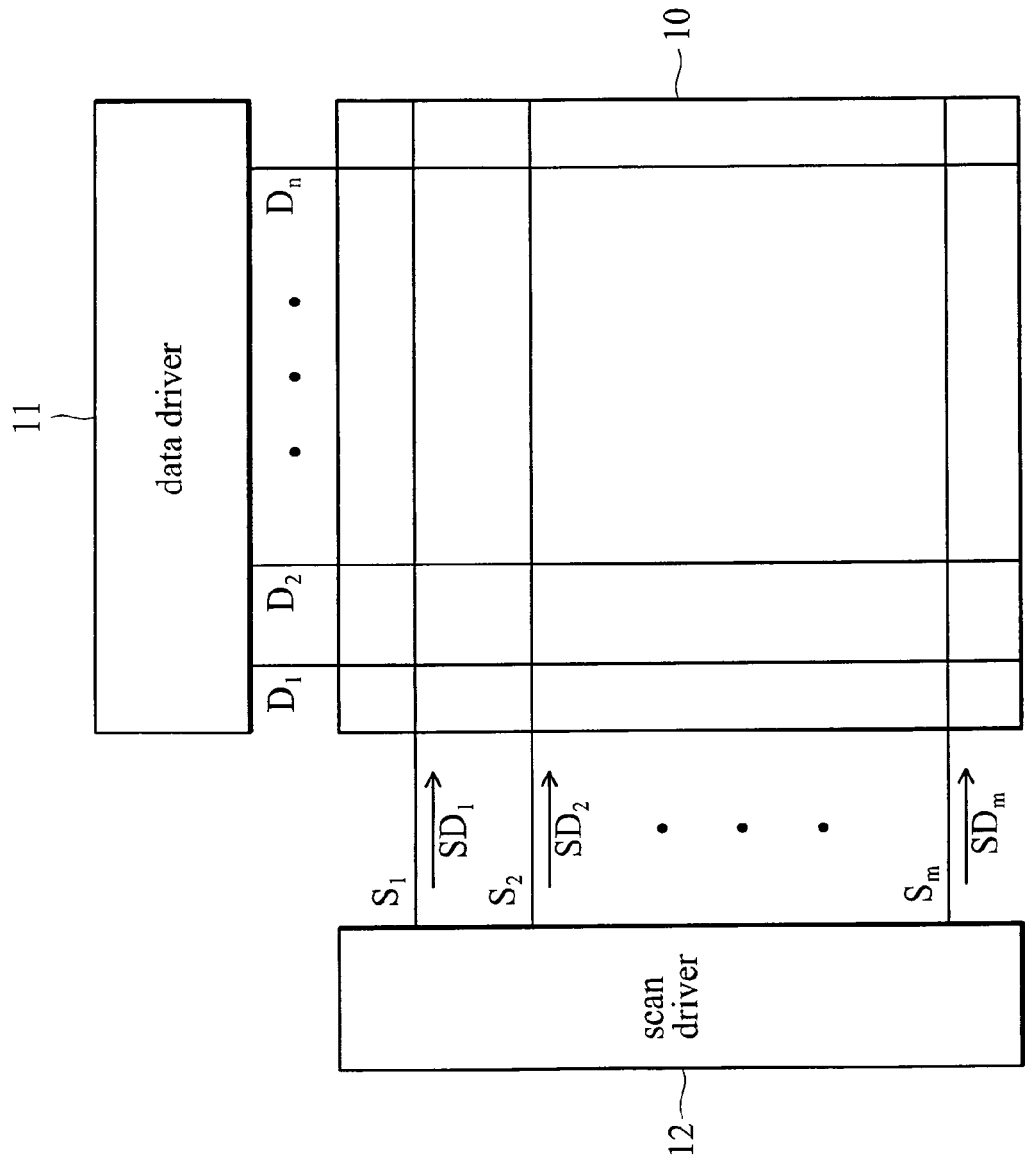
FIG. 1 is a schematic diagram of a conventional liquid crystal display panel.
Figure 2:
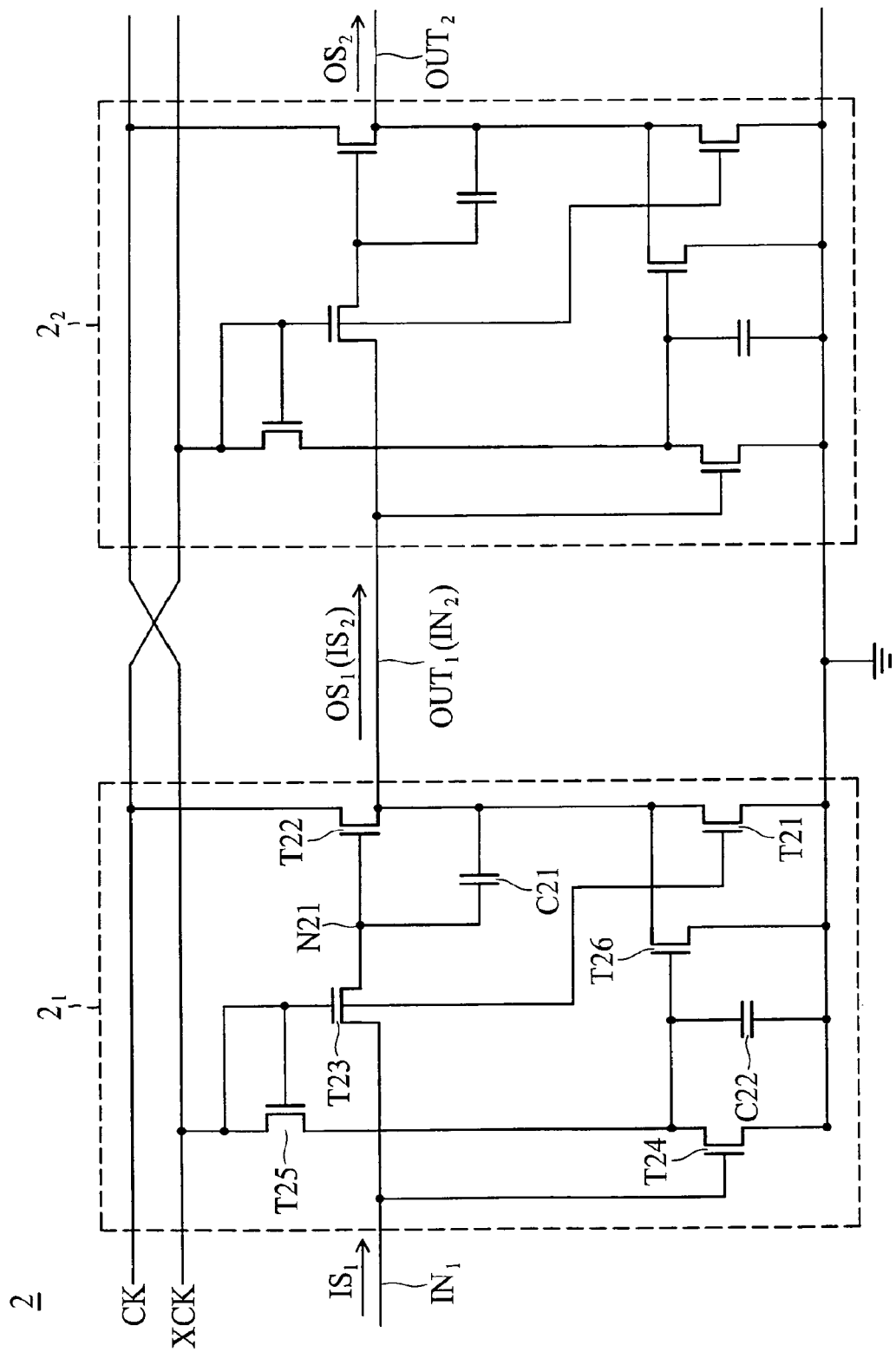
FIG. 2 shows a conventional shift register.
Figure 3:
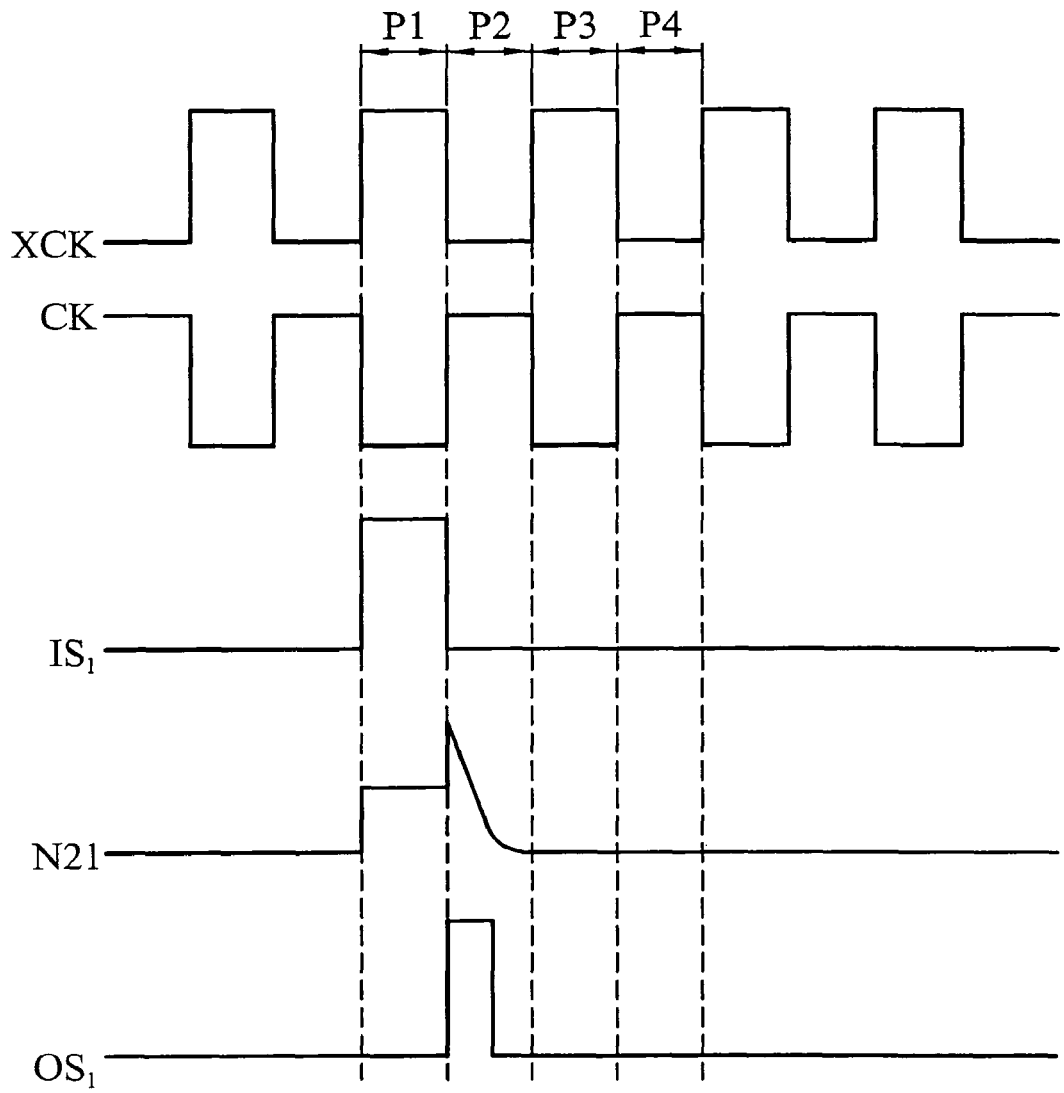
FIG. 3 is an operational timing chart of the conventional shift register unit of FIG. 2.
Figure 4:
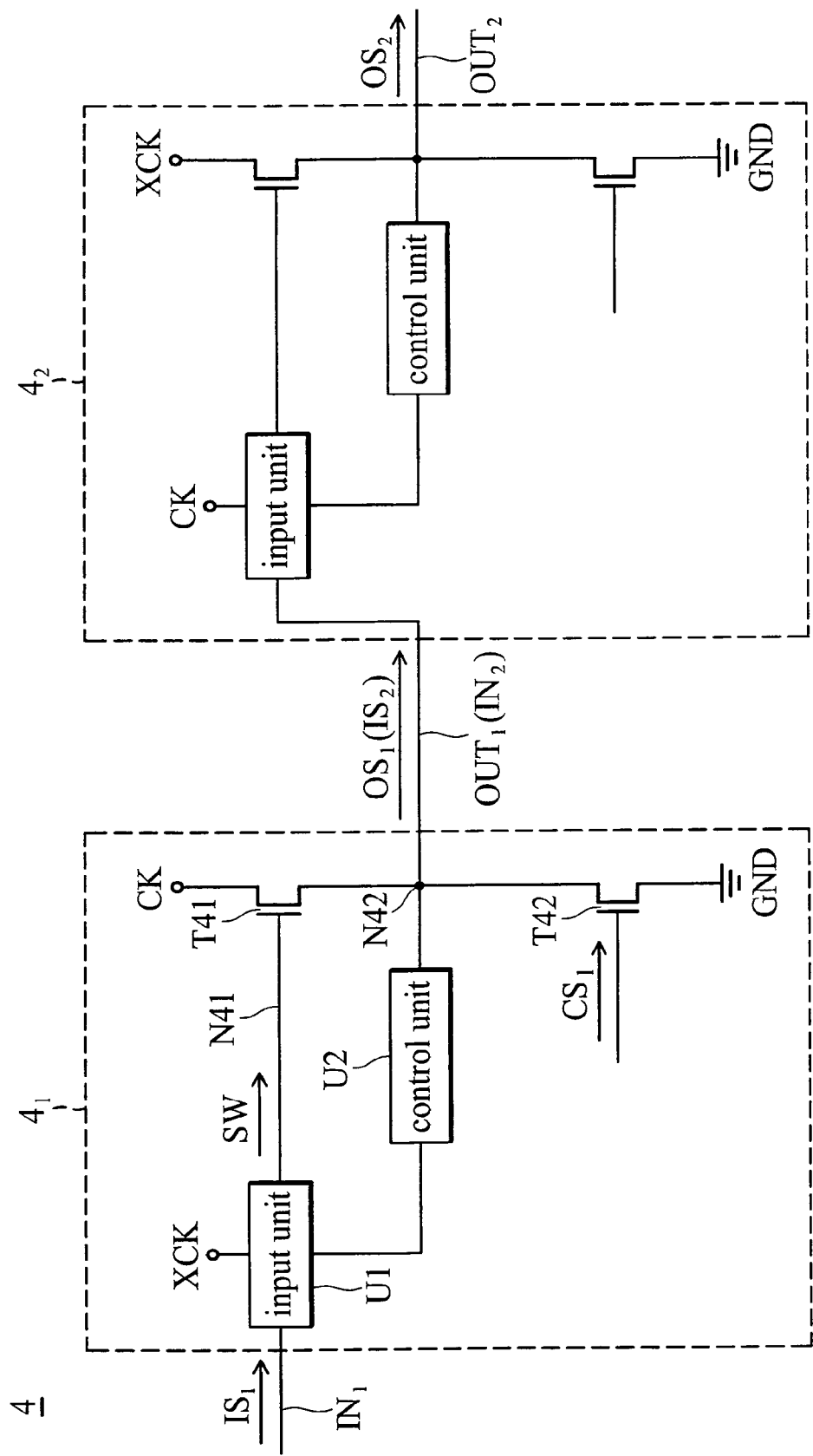
FIG. 4 shows an embodiment of a shift register.

Shift register units are provided. In an exemplary embodiment of a shift register, as shown in FIG. 4, shift register 4 comprises a plurality of identical, substantially cascaded, shift register units and is controlled by clock signals CK and XCK opposite to each other, that is, clock signals CK and XCK have inverse phases. In this embodiment, two shift register units $4_1$ and $4_2$ are given as an example. Output terminal OUT$_1$ of shift register unit 4$_1$ is coupled to input terminal IN$_2$ of shift register unit 4$_2$. Shift register unit 4$_1$ comprises input unit U1, control unit U2, and two switching units. Referring to FIG. 4, the two switching units are implemented by transistors, for example, N-type thin film transistors T41 and T42.

The gate of transistor T41 is coupled to the input unit U1 at a node N41, and the drain thereof receives clock signal CK, and the source thereof is coupled to node N42. The gate of transistor T42 receives control signal CS$_1$, the drain thereof is coupled to node N42, and the source thereof is coupled to ground GND at low logic level. Input unit U1 turns on the transistor T41 via node N41 due to coupling with transistor T41. Control unit U2 is coupled between node N42 and input unit U1.

Figure 5:
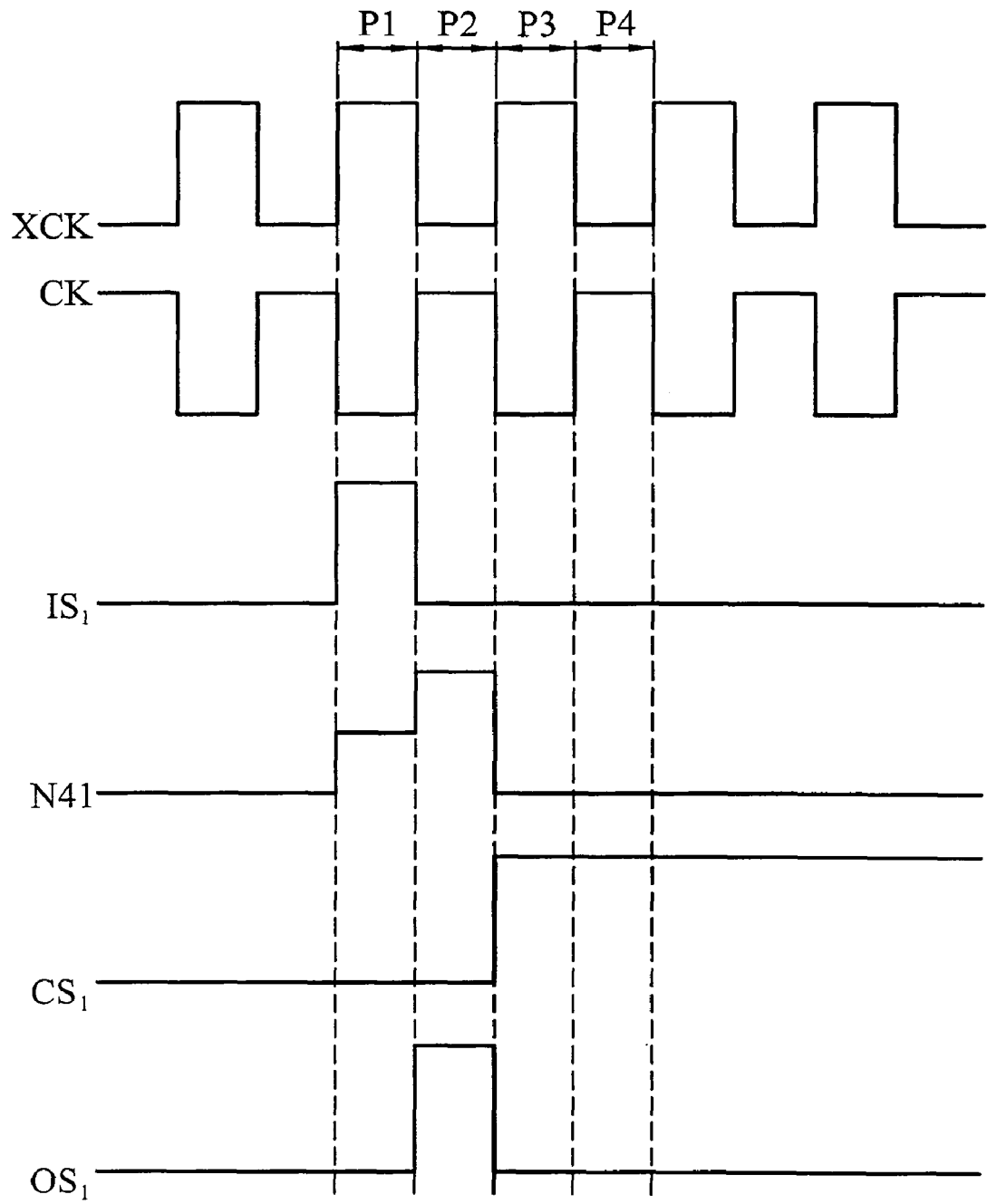
FIG. 5 is an operational timing chart of an embodiment of a shift register unit of FIG. 4.

FIG. 5 is an operational timing chart of the shift register unit of the present invention. Referring to FIGS. 4 and 5, shift register unit 4$_1$ is described. The entire duration of shifting an input signal IS$_1$ by shift register unit 4$_1$ comprises periods P1 to P4. During period P1, input signal IS$_1$ and clock signal XCK are at high logic level, that is, at first state, and clock signal CK is at low logic level, that is, at second state. Input unit U1 receives input signal IS$_1$ in response to clock signal XCK being at high logic level and outputs switching control signal SW. In other words, input unit U1 transforms input signal IS$_1$ into switching control signal SW in response to clock signal XCK. Node N41 is at high logic level to turn on transistor T41. Clock signal CK is transmitted to output terminal OUT$_1$ to serve as output signal OS$_1$ of shift register unit 4$_1$. Control signal CS$_1$ may be at high or low logic level to turn transistor T42 on or off, respectively, during period P1. In the embodiment of FIG. 4, control signal CS$_1$ is set at low logic level to turn off transistor T42. Thus, node N42 is at low logic level, that is, output signal OS$_1$ is at low logic level. If control signal CS$_1$ is set at high logic level to turn on transistor T42, the node N42 is also at low logic level.

During period P2, clock signal CK is at high logic level, and input signal IS$_1$, the clock signal XCK, and control signal CS$_1$ are at low logic level. Node N41 at high logic level has a higher voltage level due to the parasitic capacitance of transistor T41. In other words, the voltage level of switching control signal SW is higher, so that transistor T41 is turned on. Clock signal CK is transmitted to output terminal OUT$_1$ to serve as output signal OS$_1$. Control signal CS$_1$ turns off transistor T42. Thus, node N42 is at high logic level, and output signal OS$_1$ is also at high logic level. Control unit U2 controls input unit U1 in response to output signal OS$_1$, which is at high logic level, thus maintaining node N41 at high logic level and further keeping transistor T41 turned on during period P2.

During periods P3 and P4, input unit U1 controls node N41 to be at low logic level, and control signal CS$_1$ is transformed into being at high logic level to turn on transistor T42. Thus, node N42 is at low logic level, and output signal OS$_1$ is also at low logic level.

Figure 6:
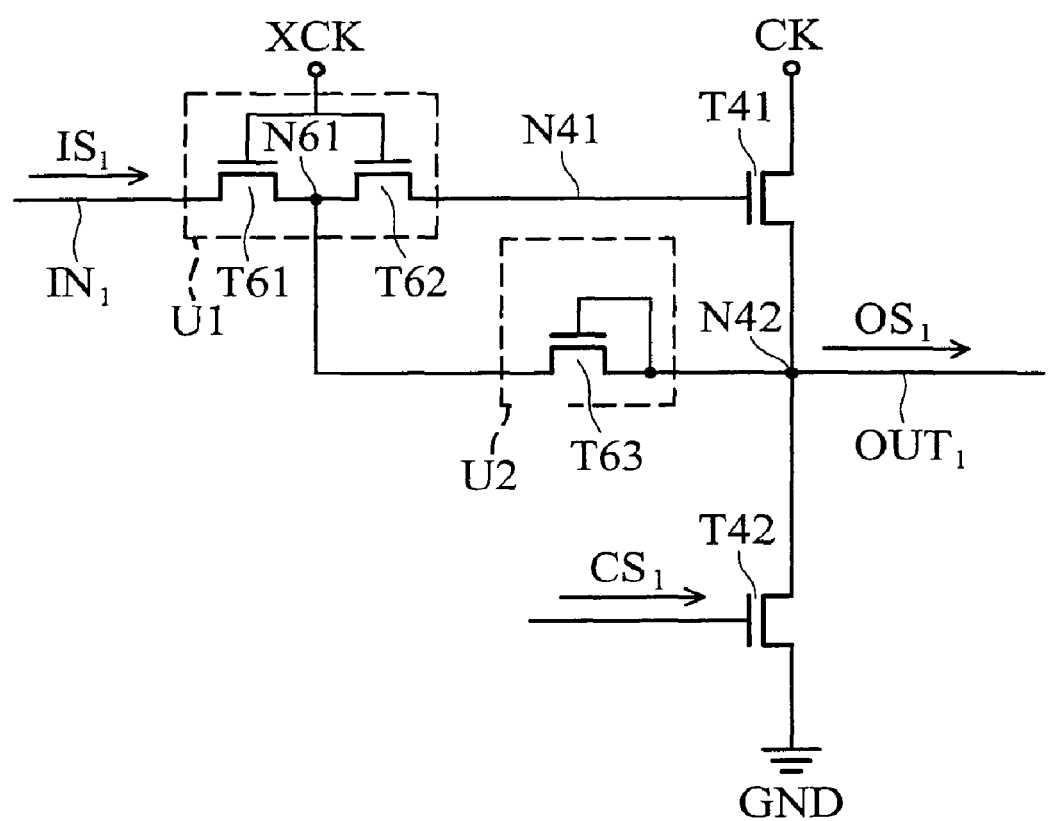
FIG. 6 shows an embodiment of a shift register.

Shift register units are provided. In an exemplary embodiment of shift register unit 4$_1$, as shown in FIG. 6, input unit U1 of shift register unit 4$_1$ comprises two transistors T61 and T62, and control unit U2 thereof comprises a diode. In this embodiment, the diode is implemented by transistor T63. Transistors T61 to T63 may be N-type thin film transistors. The gate of transistor T61 receives clock signal XCK, the drain thereof receives input signal IS$_1$, and the source thereof is coupled to node N61. The gate of transistor T62 receives clock signal XCK, the drain thereof is coupled to node N61, and the source thereof is coupled to node N41. The gate and the drain of transistor T63 are coupled to node N42, and the source thereof is coupled to node N61, so that transistor T63 serves as a diode.

Referring to FIGS. 5 and 6, during period P1, input signal IS$_1$ and clock signal XCK are at high logic level, that is, at first state, and clock signal CK and control signal CS$_1$ are at low logic level, that is, second state. Transistors T61 and T62 are turned on, and node N41 is at high logic level. Transistor T41 is turned on due to node N41 being at high logic level. Control signal CS$_1$ at low logic level turns off transistor T42. Thus, node N42 is at low logic level due to clock signal CK being at low logic level, that is, output signal OS$_1$ is at low logic level.

During period P2, clock signal CK is at high logic level; input signal IS$_1$, clock signal XCK, and control signal CS$_1$ are at low logic level. Transistors T61 and T62 are turned off. Node N41 from being at high logic level to be at higher voltage level due to the parasitic capacitance of transistor T41, thus turning on transistor T41. Control signal CS$_1$, which is at low logic level, turns off=transistor T42. Node N42 is transformed into being at high logic level, that is, =output signal OS$_1$ is at high logic level. At the same time, =output signal OS$_1$ at high logic level turns on=transistor T63, therefore, node N61 is at high logic level. During period P2, despite transistors T61 and T62 are operated in the sub-threshold region, in the turned-off region or generate undesired leakage current, node N41 remains at high logic level, and transistor T41 remains turned on because of node N61 being at high logic level. Accordingly, the output terminal OUT$_1$ outputs output signal OS$_1$ at high logic level to shift input signal IS$_1$.

During period P3, control signal CS$_1$ and clock signal XCK are at high logic level; clock signal CK and input signal IS$_1$ are at low logic level. Transistors T61 and T62 are turned on, creating a discharge path between node N41 and input terminal IN$_1$. Node N41 is transformed into being at low logic level to turn off transistor T41. Control signal CS$_1$ turns on transistor T42. Thus, output signal OS$_1$ is transformed into being at low logic level.

During period P4, control signal CS$_1$ and clock signal CK are at high logic level, and clock signal XCK and input signal IS$_1$ are at low logic level. Transistors T61 and T62 are turned off, and transistor T42 is turned on. Node N41 is at low logic level to turn off transistor T41. Thus, the output signal OS$_1$ remains at low logic level.

Figure 10:
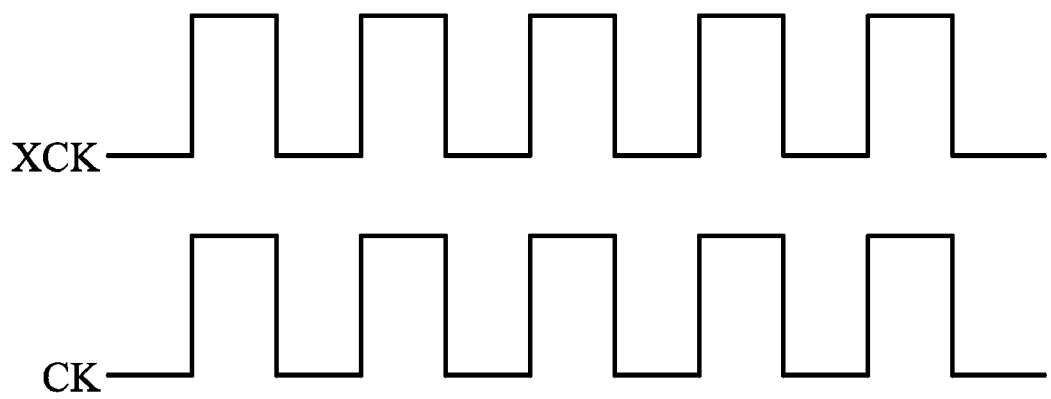
FIG. 10 shows the clock signals XCK and CK having the same phase.

As previously described, transistors T61 and T62 may be N-type thin film transistors, as an example. If transistors T61 and T62 are P-type thin film transistors and transistor T41 is N-type thin film transistor, clock signal XCK, passing through the gates of transistors T61 and T62, and clock signal CK may be in same phases as shown in FIG. 10, in other words, transistors T61, T62, and T41 may receive same clock signal source.

Figure 7:
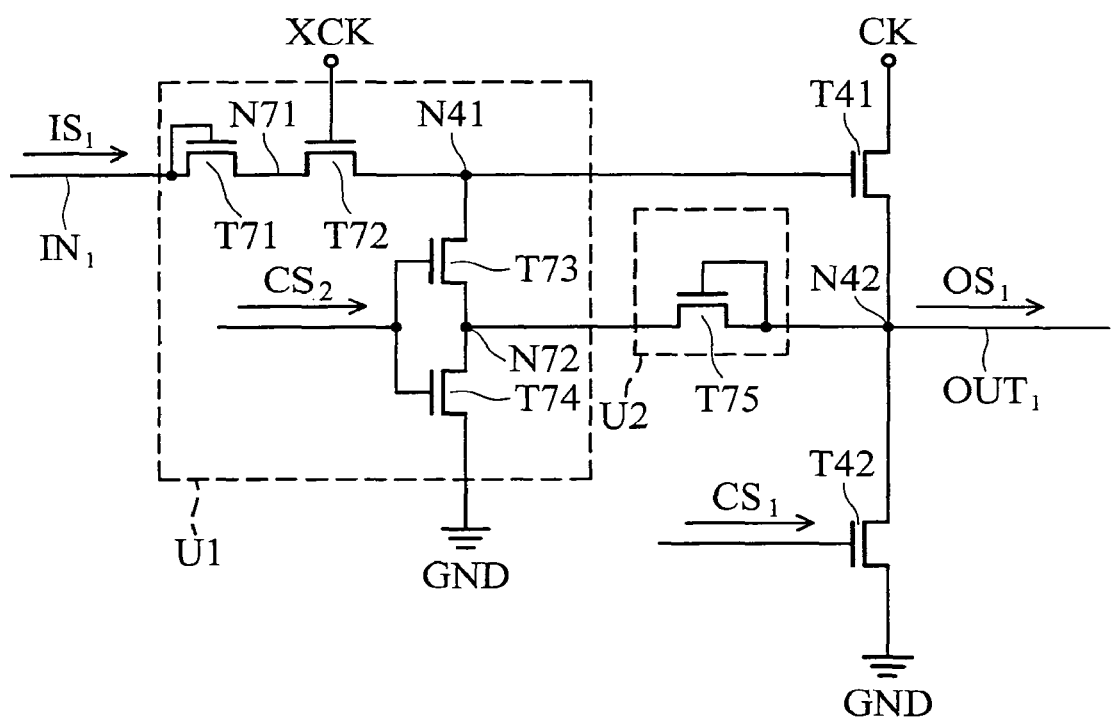
FIG. 7 is an operational timing chart of an embodiment of a shift register unit of FIG. 4.

Shift register units are provided. In an exemplary embodiment of shift register unit 4$_1$, as shown in FIG. 7, input unit U1 of shift register unit 4$_1$ comprises two transistors T71 to T74; control unit U2 thereof comprises transistor T75. Control signal CS$_2$ is further provided to input unit U1.

In input unit U1, the gate and the drain of transistor T71 receive input signal IS$_1$, and the source thereof is coupled to node N71. The gate of transistor T72 receives clock signal XCK, the drain thereof is coupled to node N71, and the source thereof is coupled to node N41. The gate of transistor T73 receives control signal CS$_2$, the drain thereof is coupled to node N41, and the source thereof is coupled to node N72. The gate of transistor T74 receives control signal CS$_2$, the drain thereof is coupled to node N72, and the source thereof is coupled to ground GND.

In control unit U2, the gate and the drain of transistor T75 are coupled to node N42, and the source thereof is coupled to node N72. In this embodiment of FIG. 7, transistors T41, T41, T71 to T75 may be N-type thin film transistors, for example.

Figure 8:
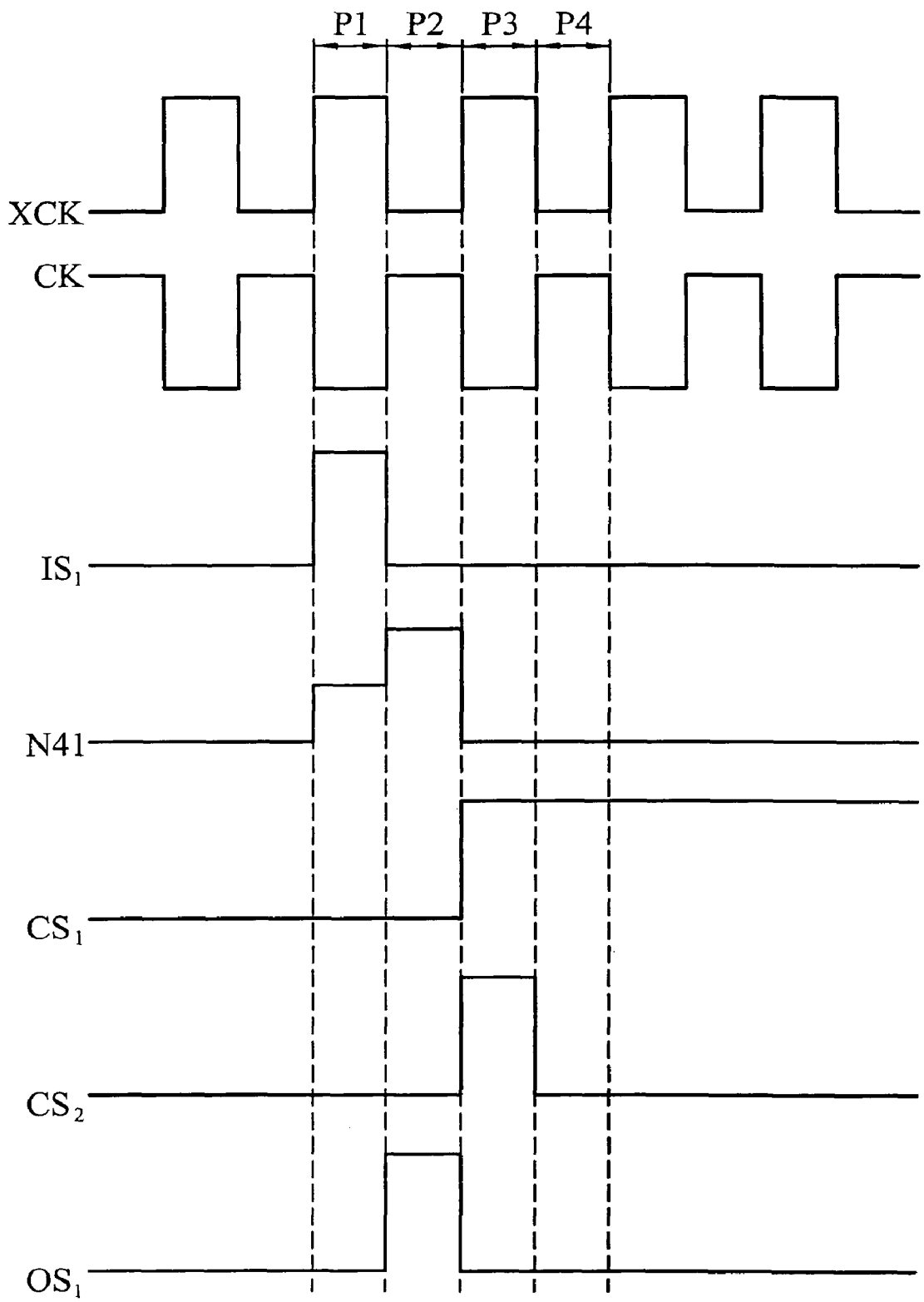
FIG. 8 shows a display panel incorporating a shift register according to an embodiment of a display panel.

FIG. 8 is an operational timing chart of shift register unit $4_1$ in FIG. 7. Referring to FIGS. 7 and 8, during period P1, input signal $IS_1$ and clock signal XCK are at high logic level, that is, at first state; clock signal CK, control signals $CS_1$ and $CS_2$ are at low logic level, that is, at second state. Transistors T71 and T72 are turned on, and transistors T73 and T74 are turned off, so that node N41 is at high logic level. Transistor T41 is turned on due to node N41 being at high logic level. Control signal $CS_1$ at low logic level turns off transistor T42. Thus, node N42 is at low logic level due to clock signal CK being at low logic level, and output signal $OS_1$ is at low logic level.

During period P2, the clock signal CK is at high logic level, and input signal $IS_1$, clock signal XCK, control signals $CS_1$ and $CS_2$ are at low logic level. Transistors T71 and T72 and transistors T73 and T74 are still turned off. Node N41 at high logic level has a higher voltage level due to the parasitic capacitance of transistor T41, thus transistor T41 turns on. Control signal $CS_1$ turns off transistor T42. Node N42 is transformed into being at high logic level, that is, output signal $OS_1$ is at high logic level. At the same time, output signal $OS_1$ at high logic level turns on transistor T75, and node N72 is at high logic level. During period P2, even through transistors T73 and T74 operate in the sub-threshold region or turned-off region to generate undesired leakage current, node N41 remains at high logic level, and transistor T41 remains turned on. Accordingly, output terminal $OUT_1$ outputs output signal $OS_1$ being at high level for shifting input signal $IS_1$.

During period P3, control signals $CS_1$, $CS_2$ and clock signal XCK are at high logic level; clock signal CK and input signal $IS_1$ are at low logic level. Transistor T71 is turned off, and transistors T72 to T74 are turned on. Since transistor T71 serves as a diode, a discharge path is created between node N41 and transistor T74, rather than between node N71 and input terminal $IN_1$. Node N41 is transformed into being at low logic level to turn off transistor T41. Control signal $CS_1$ turns on transistor T42. Thus, output signal $OS_1$ is transformed into being at low logic level.

During period P4, control signal $CS_1$ and clock signal CK are at high logic level; control signal $CS_2$, clock signal XCK, and input signal $IS_1$ are at low logic level. Transistors T71 to T74 are turned off, while transistor T42 is turned on. Node N41 is at low logic level to turn off transistor T41. Thus, output signal $OS_1$ remains at low logic level.

As previously described, in some embodiments of a shift register unit, control unit U2 is used to solve or prevent the problem of undesired leakage current happened because the transistors of input unit U1 may be operated in the sub-threshold region or in the turned-off region. During period P2, input unit U1 controls node N41 being at high logic level, so that transistor T41 maintains turned on. Accordingly, output terminal $OUT_1$ outputs output signal $OS_1$ being at high level for shifting input signal $IS_1$.

Figure 9:
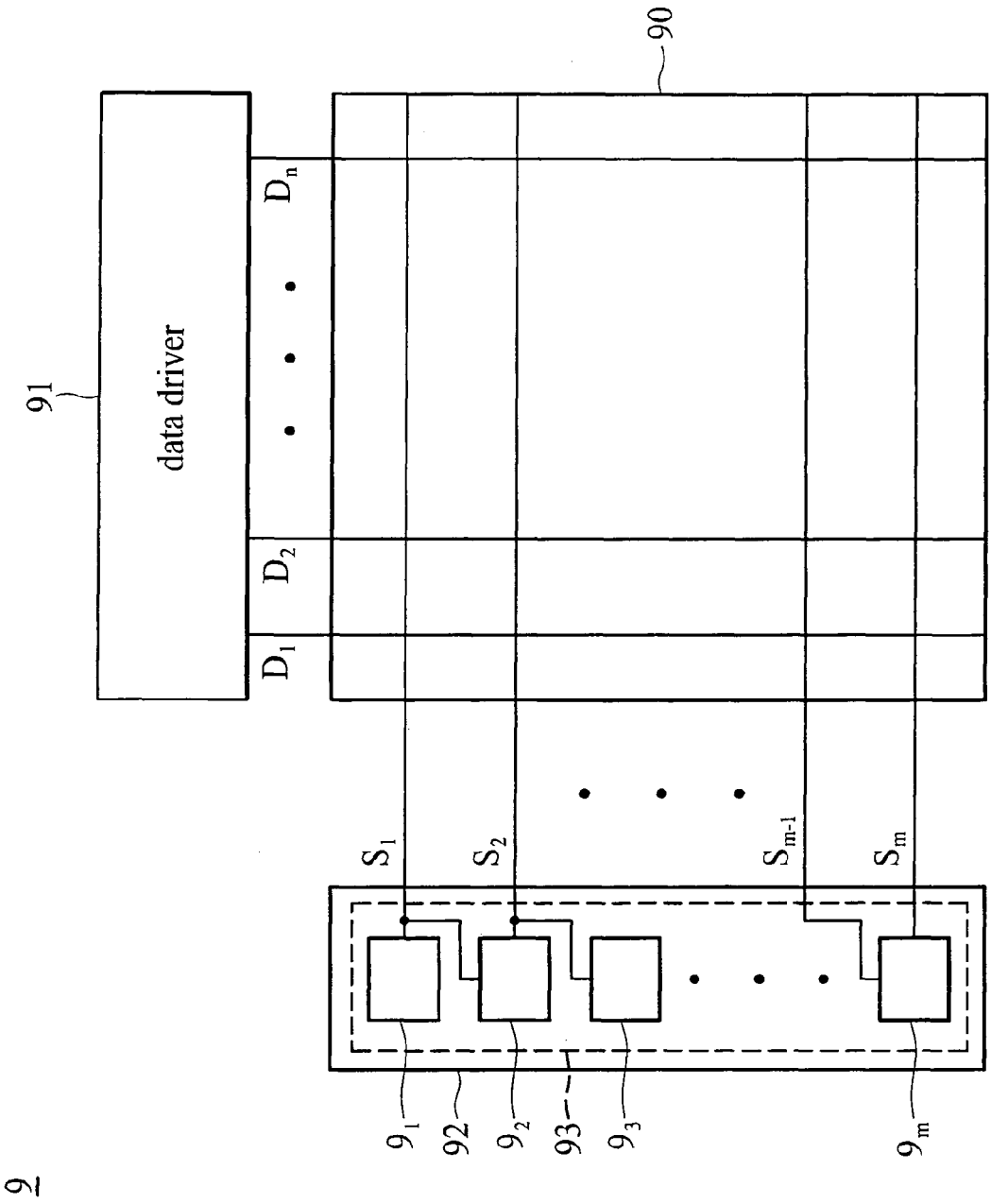
FIG. 9 shows an embodiment of a liquid crystal display panel.

Some embodiments of a shift register can be applied in data or scan drivers within a display panel in FIG. 9, such as data driver 91 and scan driver 92 within display panel 9. Display panel 9 further comprises display array 90 defined by a plurality scan lines $S_1$ to $S_m$ and a plurality of data lines $D_1$ to $D_n$. For example, an embodiment of shift register 93 is applied in scan driver 92. Shift register 93 comprises a plurality of shift register units $9_1$ to $9_m$, each of which may have the same circuitry as shown in FIG. 4. An output signal of each shift register unit is provided not only to a next shift register unit to serve as an input signal thereof but also to a corresponding scan line.

In embodiments of a shift register unit, control signal $CS_1$ may be at high or low logic level during period P1, with no effect on the logic level of output signal $OS_1$. The embodiments of FIGS. 6 and 7 describe control signal $CS_1$ being at low logic level as an example during period P1, without limitation.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for improving current leakage of a shift register having a plurality of shift register units substantially cascaded, each having an input terminal and an output terminal, the method comprising:
   receiving an input signal;
   transforming the input signal to a switching control signal in response to a first clock signal;
   transmitting a second clock signal to the output terminal in response to the switching control signal to serve as an output signal of the shift register unit;
   maintaining the state of the switching control signal in response to the second clock signal; and
   adjusting a level of the output terminal to be at a low logic level in response to a first control signal,
   wherein the step of maintaining the state comprises adjusting the control signal to be at a low logic level in response to a second control signal.

2. The method as claimed in claim 1, wherein the first and second clock signals have same phases.

3. The method as claimed in claim 1, wherein the first and second clock signals have inverse phases.

* * * * *